United States Patent
Hsiao et al.

(10) Patent No.: US 7,559,784 B2
(45) Date of Patent: Jul. 14, 2009

(54) IC SOCKET

(75) Inventors: Shih-Wei Hsiao, Tu-cheng (TW); Sung-Pei Hou, Tu-cheng (TW); Wen-Yi Hsieh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/151,543

(22) Filed: May 7, 2008

(65) Prior Publication Data
US 2008/0280477 A1   Nov. 13, 2008

(30) Foreign Application Priority Data
May 7, 2007   (TW) .............................. 96207255 U

(51) Int. Cl.
*H01R 13/62* (2006.01)
(52) U.S. Cl. ........................................ 439/331; 439/71
(58) Field of Classification Search ................. 439/331, 439/330, 70, 71, 72, 525
See application file for complete search history.

(56) References Cited

U.S. PATENT DOCUMENTS

| 5,247,250 A | 9/1993 | Rois |
| 5,376,010 A | 12/1994 | Petersen |
| 6,162,066 A * | 12/2000 | Glick et al. .................... 439/73 |
| 7,458,820 B2 * | 12/2008 | Ohta ............................ 439/73 |
| 2007/0020983 A1 * | 1/2007 | Yang et al. ................... 439/331 |
| 2007/0238327 A1 * | 10/2007 | Hsu ............................. 439/70 |
| 2008/0020623 A1 * | 1/2008 | Wooden ..................... 439/331 |

FOREIGN PATENT DOCUMENTS

JP   H10-125426   5/1998

\* cited by examiner

*Primary Examiner*—Hien Vu
(74) *Attorney, Agent, or Firm*—Wei Te Chung

(57) ABSTRACT

An IC socket includes a socket body with a plurality of contacts disposed therein, a cover rotatablely coupled to the socket body and at least one slider in the socket body. The socket body defines a receiving space for receiving an IC package, and the cover has a driving member. The slider has one end engageable with the driving member and the other end extending toward the receiving space. When the IC socket is in a close position, the slider touches the IC package or close to the IC package to keep a reliable connection between the IC socket and the IC package.

9 Claims, 7 Drawing Sheets

IC SOCKET

BACKGROUND OF THE INVENTION

1. Field of the Invention

This invention relates to a socket, and more particularly, to a socket for receiving an electrical element such as an IC (integrated circuit) package.

2. Description of the Related Art

Usually, a socket is needed to receive an IC package and make electrical connection between the IC package and a circuit board on which the socket is mounted. A typical prior art socket which is used for receiving an IC package is disclosed in Japanese patent application publication NO. 10-125426. This type of IC socket usually comprises a base with a platform thereon and a rotatable lid that covers the base and presses on the IC package when the socket is in a close position. Sometimes the dimension of IC package may be smaller than that of a corresponding loading space defined by the platform, and thus one or more edge/edges of the IC package may be spaced from corresponding positioning wall/walls set on the platform. Because of the space generated between the positioning wall/walls and the edge/edges of the IC package, there is a relative movement and thus an unreliable connection between the IC package and the socket. If an extra positioning member or the like is provided for making the IC package steady relative to the socket, an expected ZIF (zero insertion force) may not be achieved because of the interference generated between the edge/edges of IC package and above-mentioned positioning member during the insertion of the IC package.

BRIEF SUMMARY OF THE INVENTION

Accordingly, it is an object of the present invention to provide an IC socket able to keep a reliable connection with an IC package.

According to an embodiment of the present invention, an IC socket includes a socket body with a plurality of contacts disposed therein, the socket body defining a receiving space, a cover rotatably coupled to the socket body and having a driving member, and at least one slider in the socket body, with one end engageable with the driving member and the other end extending toward the receiving space.

It is another object of the present invention to provide an IC socket wherein an IC package is inserted without any insertion force.

According to an embodiment of the present invention, the IC socket for receiving an IC package includes a socket body with a plurality of contacts disposed therein, a cover movable above the socket body, and at least one slider engageable with the cover, wherein the IC package is able to inserted to the socket body without any insertion force when the IC socket is in an open position, and the slider extends toward the IC package when the IC socket is in a close position.

Other objects, advantages and novel features of the present invention will become more apparent from the following detailed description of the present embodiment when taken in conjunction with the accompanying drawings.

DETAILED DESCRIPTION OF THE INVENTION

Figure 1:
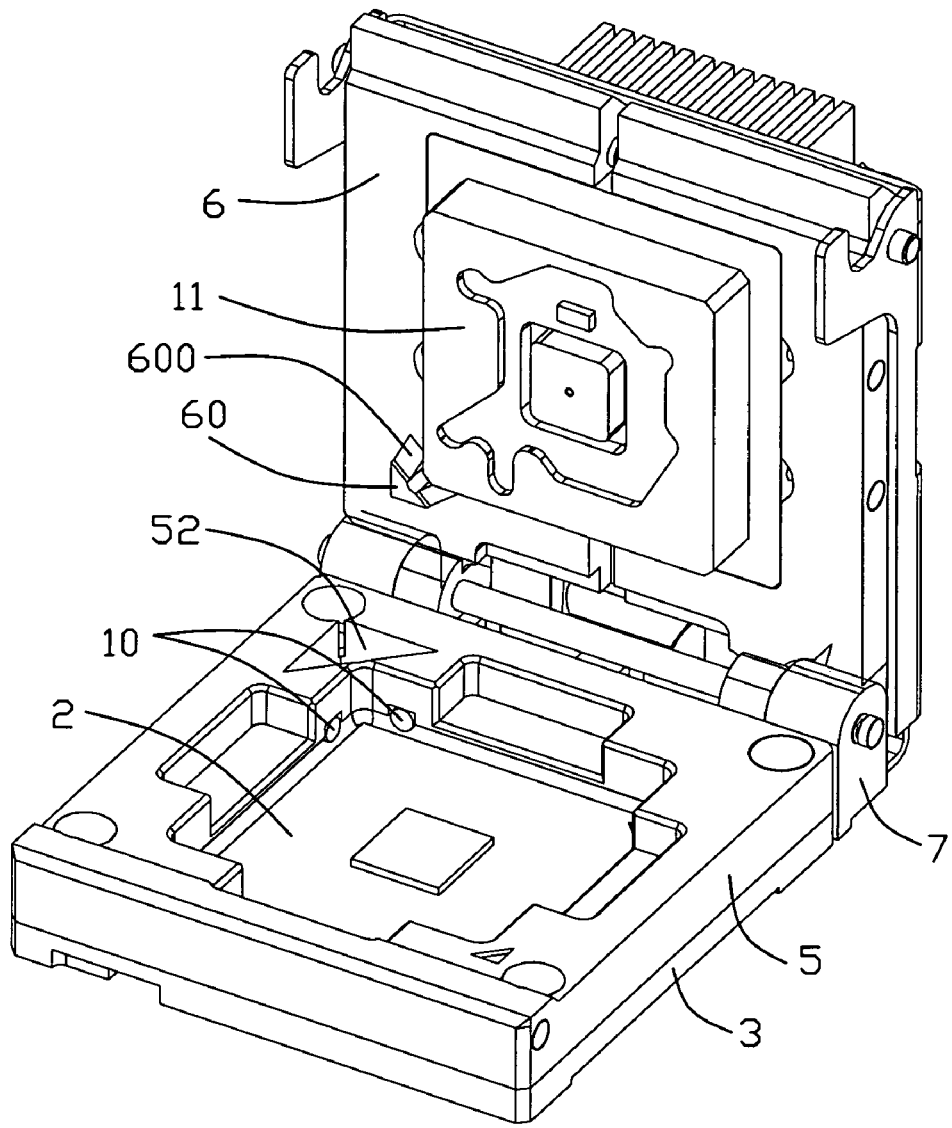
FIG. 1 is an assembled, perspective view of an IC socket according to an embodiment of the present invention.
Figure 2:
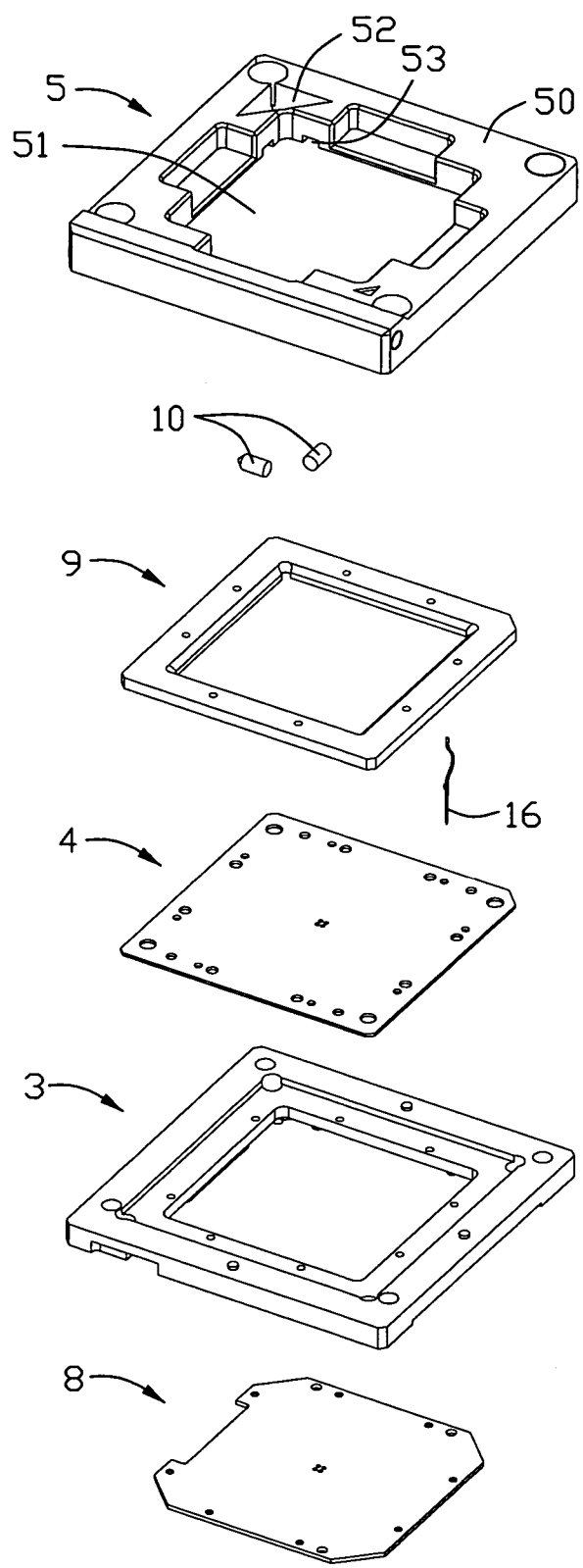
FIG. 2 is an exploded, perspective view of a socket body according to the embodiment of the present invention.
Figure 3:
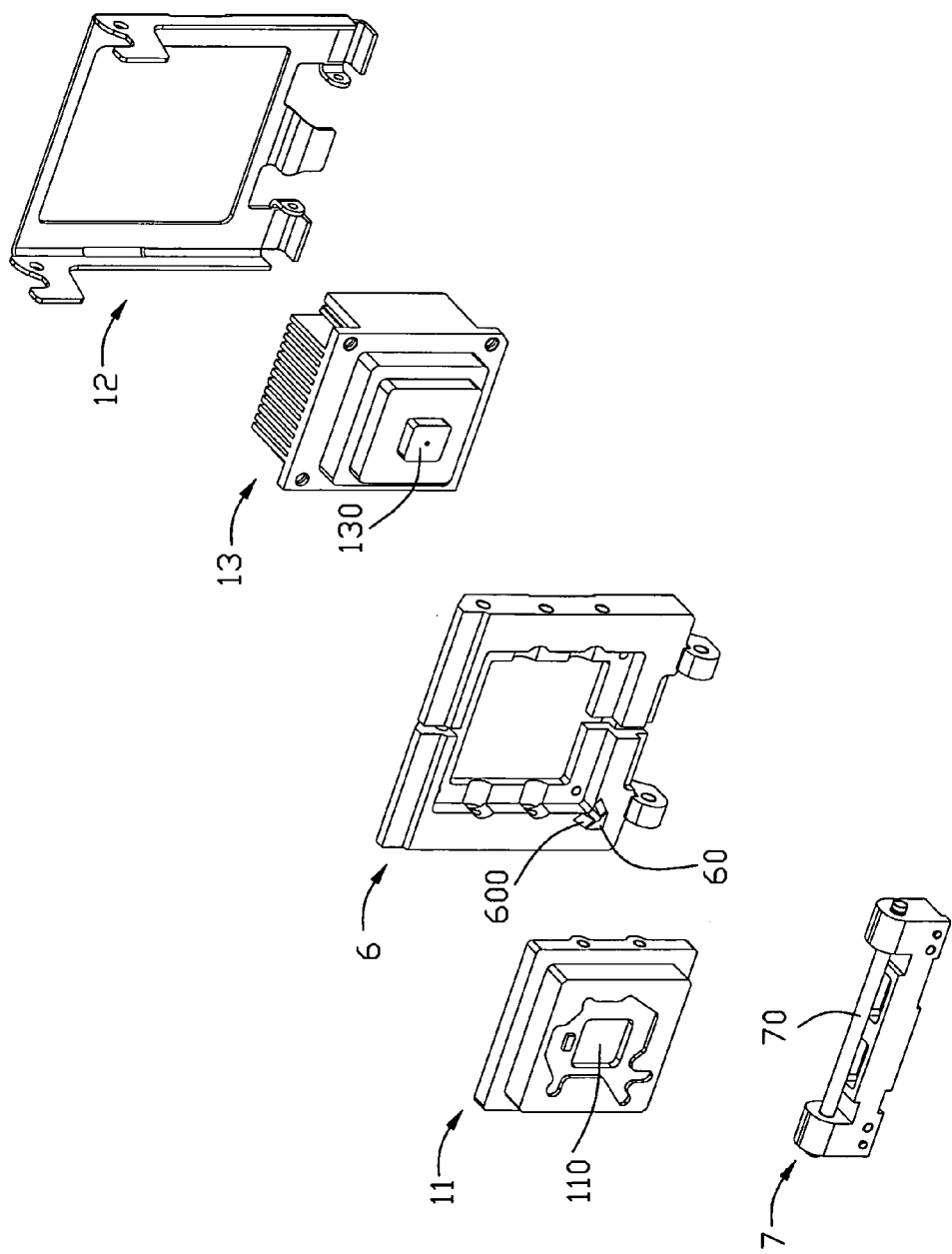
FIG. 3 is an exploded, perspective view of a cover, a heat sink and a connecting member according to the embodiment of the present invention.

Referring to FIG. 1 to FIG. 3, the IC socket 1 mainly includes a socket body mounted to a printed circuit board (not shown), a plurality of contacts 16 disposed in the socket body, a cover movable above the socket body and rotatablely coupled to the socket body, and a heat sink 13 fixed to the cover.

The socket body is a assembly that comprises a base 3 holding a positioning plate 4 thereon, a frame 5 above the base, a padding 9 between the base 3 and the frame 5, and a bottom plate 8 under the bottom of the base 3. The positioning plate 4 and the bottom plate 5 respectively has a plurality of through holes (not labeled) for the insertion of the contacts 16.

Figure 4:
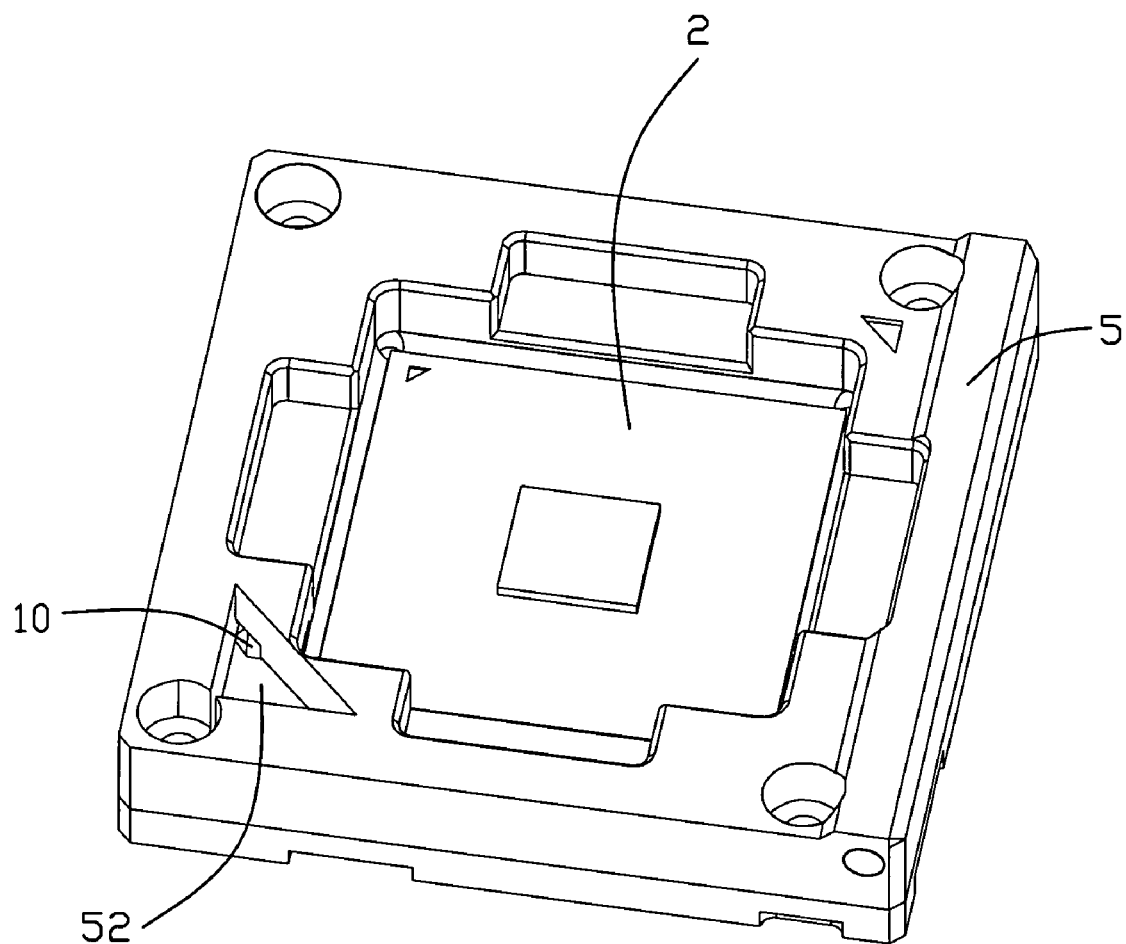
FIG. 4 is an assembled, perspective view of the socket body with an IC package therein and a pair of sliders according to the embodiment of the present invention.
Figure 5:
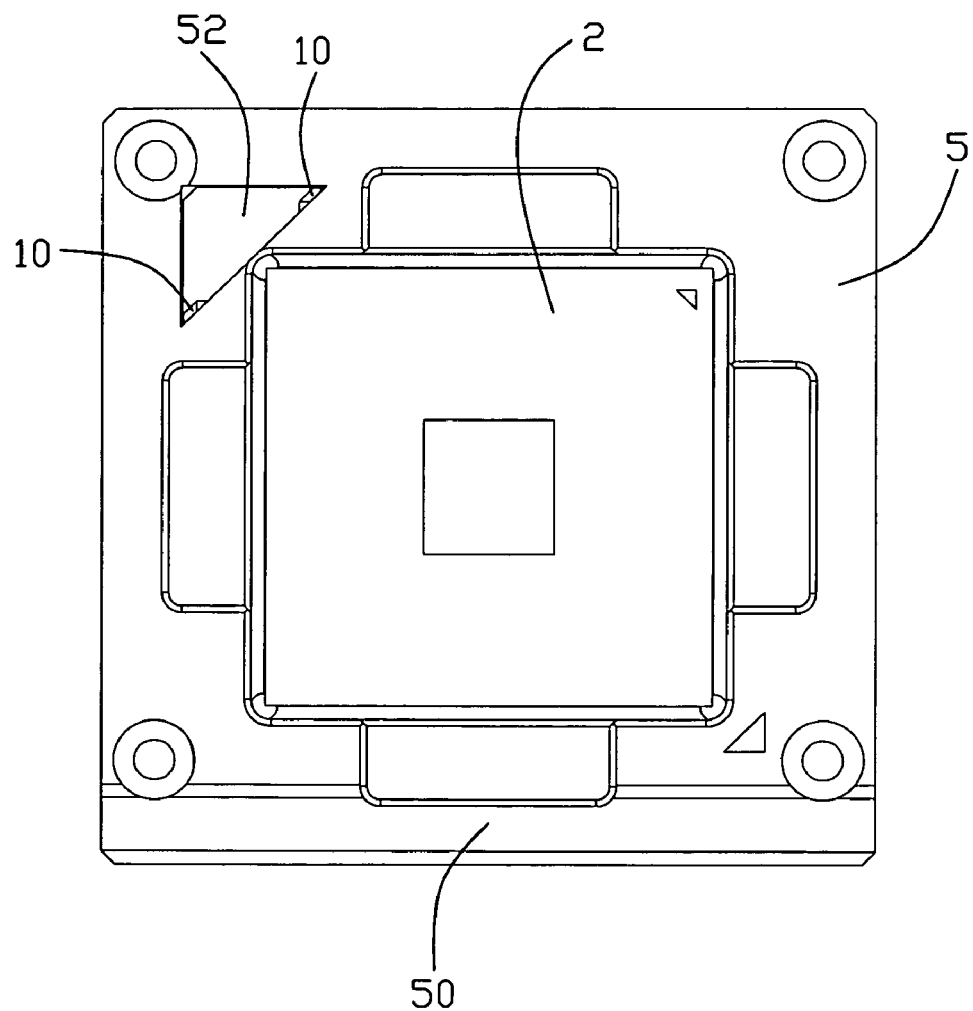
FIG. 5 is a top view of the FIG. 4.
Figure 6:
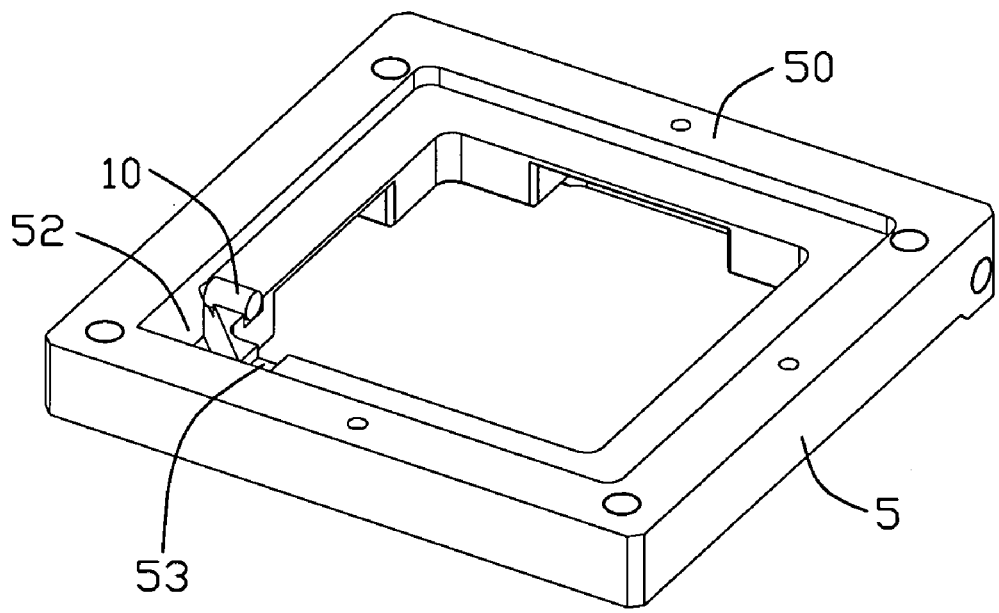
FIG. 6 is perspective view of a frame with a slider retained therein according to the embodiment of the present invention.

The frame 5 is formed with four rims 50 defining a receiving space 51 for the accommodation of an IC package 2. A substantially triangular thought hole 52 is formed in one corner of the frame 5 and in the vicinity of the receiving space 51. Referring to FIG. 4 to FIG. 6 especially, a pair of slots 53 perpendicular to each other extends in the bottom of two adjacent rims 50. Each of the slots 53 is perpendicular to the rim 50 from which the slot 53 is formed. The slots 53 and the through hole 52 are open to each other. A pair of sliders 10 are respectively retained in the slots 53, with one subulate end positioned in the through hole 52 and the other end extending toward the receiving space 51.

The cover is an assembly that coupled to the socket body by a connecting member 7 having a rod 70. The cover comprises a lid 6 that is formed with a frame configuration, a pressing member 11 assembled to the bottom of the lid 6 and a metal fastener 12 on the top of the cover. A heat sink 13 is assembled to the cover along an up-to-down direction, with a touching portion 130 extending through an opening 110 defined by the pressing member 11. A substantially triangular driving member 60 with a guiding face 600 is formed on the bottom of the lid 6.

When the IC socket 1 is in an open position, the IC package could be loaded manually into socket body without any insertion force due to the relative larger dimension of the receiving space 51. When the cover is rotated toward the socket body, the driving member 60 in the bottom of the lid 6 moves with the cover, then gets into the triangular thought hole 52 and drives the sliders 10. The driving member 60 engages with each subulate end of the two sliders 10 and enables the sliders 10 to move along the slots 53 and toward the receiving space 51. When the IC socket gets into a close position, each slider 10 is far away from its original position, with its subulate end abutting against the guiding face 600, and the opposite end touching the IC package 2 or close to the IC package 2. So the movement of the IC package 2 is restricted by the sliders 10 when the IC socket 1 is in a close position, and it enables the IC package 2 to position in the receiving space steadily with a reliable electrical connection with the IC socket 1. If it is needed to receive another IC package, the IC socket 1 can be opened up with the driving member 60 away from the through hole 52 and the previous IC package can be picked out. The sliders 10 can be retreated manually to an original position.

Figure 7:
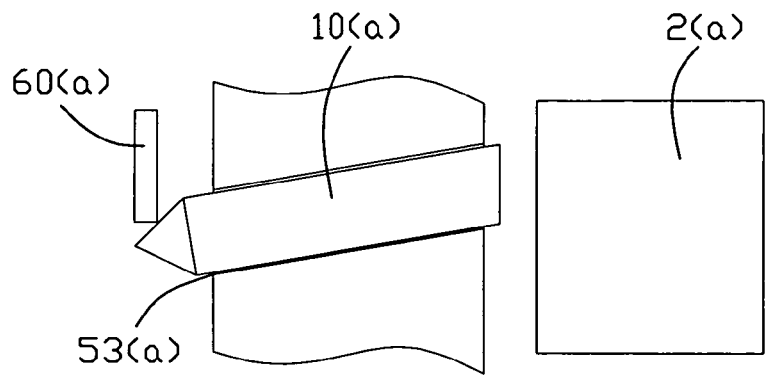
FIG. 7 is an illustrating view according to a second embodiment of the present invention.

FIG. 7 illustrates a second embodiment according to the present invention. To restrict the movement of an IC package 2(*a*), the slider 10(*a*) is retained in a slot 53(*a*) angular relative to a horizontal plane. When a driving member 60(*a*) moves upwardly and releases it's engaging with the slider 10(*a*), the slider 10(*a*) will slide downwardly by its gravity and far away from the IC package 2(*a*).

Figure 8:
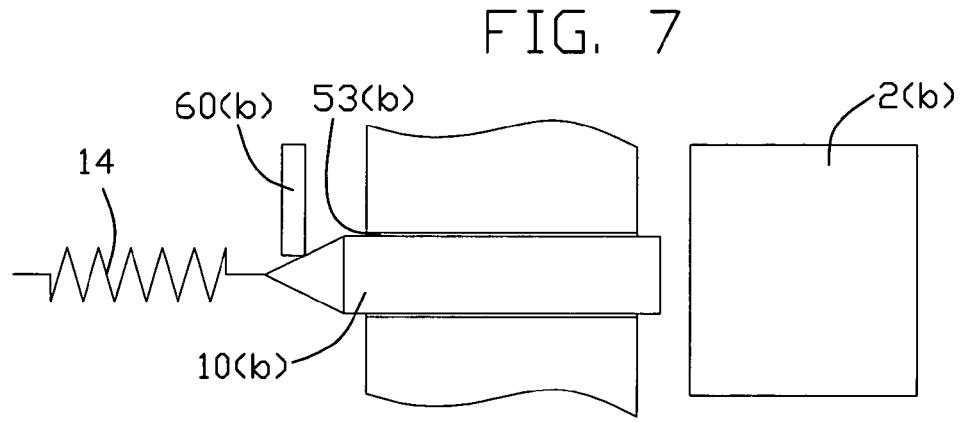
FIG. 8 is an illustrating view according to a third embodiment of the present invention.

FIG. 8 illustrates a third embodiment according to the present invention. The difference compared to the first embodiment is that an extra spring 14 is provided for connecting one end of the slider 10(*b*) retained in a slot 53(*b*) and engaged with a driving member 60(*b*). When the driving member 60(*b*) moves upwardly and releases it's engaging with the slider 10(*b*), the slider 10(*b*) will be retreated back by the spring force of the spring 14 and far away from an IC package 2(*b*).

Figure 9:
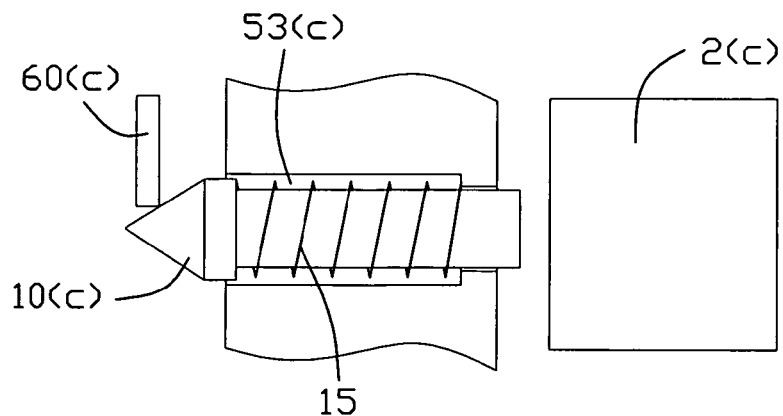
FIG. 9 is an illustrating view according to a fourth embodiment of the present invention.

FIG. 9 illustrates a fourth embodiment according to the present invention. The difference compared to the third embodiment is that the slider 10(*c*) retained in a slot 53(*c*) can be divided to a thick part with a subulate end engaged with a driving member 60(*c*) and a thin part with the other end touching an IC package 2(*c*) or close to the IC package 2(*c*), and an extra spring 15 is provided encircling the thin part. When the driving member 60(*c*) moves upwardly and releases it's engaging with the slider 10(*c*), the slider 10(*c*) will be retreated back by the spring force of the spring 15 and far away from the IC package 2(*c*).

What is claimed is:

1. An IC socket comprising:
   a socket body with a plurality of contacts disposed therein, said socket body defining a receiving space;
   a cover rotatablely coupled to said socket body and having a driving member; and
   at least one slider in the socket body, with one end engageable with the driving member and the other end extending toward the receiving space for engaging with an IC package to restrict movement of the IC package; and new lines have been inserted after the last line as following:
   wherein said cover comprises a lid and a pressing member assembled to the lid, said driving member being formed on the lid;
   wherein said socket body comprises a frame formed with four rims and at least one slot in one of the rims, said slider being a pin retained in the slot and being able to slide along the slot;
   wherein said frame is further formed with a through hole therein and connected to the slot in the rim and said through hole opens to a top surface of the frame.

2. The IC socket according to claim 1, wherein said at least one slot consists of two slots, the two slots being formed respectively in two adjacent rims and perpendicular to the rims respectively.

3. The IC socket according to claim 1, wherein said socket body comprise a base holding a positioning plate thereon.

4. The IC socket according to claim 1, wherein said slider is angular relative to a horizontal plane, and is able to slide downwardly.

5. The IC socket according to claim 1, wherein said slider is engaged with a spring.

6. An IC socket for receiving an IC package comprising:
   a socket body with a plurality of contacts disposed therein;
   a cover movable above the socket body; and
   at least one slider having one end engageable with the driving member of the cover;
   wherein the IC package is able to inserted to the socket body without any insertion force when the IC socket is in an open position, and the slider extends toward the IC package when the IC socket is in a close position, the slider engaged with the IC package to restrict movement of the IC package;
   wherein said cover is formed with a driving member able to drive the slider;
   wherein said socket body comprises a frame formed with four rims, one of the rims having at least a slot, said slider being a pin retained in the slot and being able to slide along the slot;
   wherein said frame is further formed with a through hole therein and connected to the slot in the rim and said through hole opens to a top surface of the frame.

7. The IC socket according to claim 6, wherein said slider is configured with a subulate end engageable with the driving member.

8. The IC socket according to claim 6, wherein said slider is angular relative to a horizontal plane, and is able to slide downwardly.

9. The IC socket according to claim 6, wherein said slider is engaged with a spring.

* * * * *